US012777647B2

(12) United States Patent
Heo

(10) Patent No.: US 12,777,647 B2
(45) Date of Patent: Oct. 27, 2026

(54) SEMICONDUCTOR DEVICE INCLUDING CONTACT PLUGS AND METHOD OF MANUFACTURING THE SAME

(71) Applicant: SK hynix Inc., Gyeonggi-do (KR)

(72) Inventor: Min Young Heo, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 368 days.

(21) Appl. No.: 18/500,109

(22) Filed: Nov. 2, 2023

(65) Prior Publication Data

US 2025/0040138 A1 Jan. 30, 2025

(30) Foreign Application Priority Data

Jul. 25, 2023 (KR) ........................ 10-2023-0096491

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS

| | | | |
|---|---|---|---|
| 8,664,108 B2 | 3/2014 | Mizukami et al. | |
| 9,601,502 B2 | 3/2017 | Sano et al. | |
| 2004/0214436 A1* | 10/2004 | Dow ................. | H01L 21/76877 257/E21.585 |
| 2017/0084626 A1* | 3/2017 | Kim .................. | H01L 21/76831 |

* cited by examiner

*Primary Examiner* — Norman D Richards
*Assistant Examiner* — Sean Ayers Winters
(74) *Attorney, Agent, or Firm* — IP&T GROUP LLP

(57) ABSTRACT

A semiconductor device may include a gate structure including insulating layers and conductive layers that are alternately stacked, a contact plug extending through the gate structure to connect to at least one of the conductive layers, and first insulating spacers that are disposed between the respective conductive layers and the contact plug. A lowest first insulating spacer, among the first insulating spacers, may have a first thickness. The remaining first insulating spacers may each have a second thickness greater than the first thickness.

23 Claims, 21 Drawing Sheets

SEMICONDUCTOR DEVICE INCLUDING CONTACT PLUGS AND METHOD OF MANUFACTURING THE SAME

CROSS-REFERENCE TO RELATED APPLICATION

This application claims priority under 35 U.S.C. § 119 to Korean Patent Application No. 10-2023-0096491 filed on Jul. 25, 2023, which is incorporated herein by reference in its entirety.

BACKGROUND

1. Technical Field

Embodiments relate to an electronic device and a method of manufacturing an electronic device and, more particularly, to a semiconductor device and a method of manufacturing a semiconductor device.

2. Related Art

The degree of integration of semiconductor devices is generally determined by the area that is occupied by a unit memory cell. As the improvement of the degree of integration of semiconductor devices in which a memory cell is formed on a substrate as a single layer recently reaches its limit, a three-dimensional semiconductor device in which memory cells are stacked on a substrate is proposed. Furthermore, in order to improve operation reliability of such a semiconductor device, various structures and manufacturing methods are developed.

SUMMARY

In an embodiment, a semiconductor device may include a gate structure including insulating layers and conductive layers that are alternately stacked, a contact plug extending through the gate structure and that is connected to at least one of the conductive layers, and first insulating spacers that are disposed between the respective conductive layers and the contact plug. A lowest first insulating spacer, among the first insulating spacers, may have a first thickness. The remaining first insulating spacers may each have a second thickness greater than the first thickness.

In an embodiment, a semiconductor device may include a gate structure including insulating layers and conductive layers that are alternately stacked, a contact plug including a first part that is connected to at least one of the conductive layers and a second part that is connected to the first part and extending through the gate structure, a bottom spacer that surrounds the first part of the contact plug, and sidewall spacers that surround the second part of the contact plug. The sidewalls of the sidewall spacers may protrude more into the contact plug than the sidewall of the bottom spacer.

In an embodiment, a method of manufacturing a semiconductor device may include forming a stack by alternately stacking first material layers and second material layers, forming first openings extending through the stack and that expose the second material layers, forming second insulating spacers by oxidizing the second material layers through the first openings, forming supports within the first openings, respectively, forming second openings extending through the stack and that expose the second material layers, forming first insulating spacers by oxidizing the second material layers that have been exposed through the second openings, and forming contact plugs within the second openings, respectively.

In an embodiment, a method of manufacturing a semiconductor device may include forming a stack by alternately stacking first material layers and second material layers, forming an opening extending through the stack and that exposes the second material layers, forming a preliminary bottom spacer and sidewall spacers by oxidizing the second material layers that have been exposed through the opening, forming a gate structure by substituting the second material layers with the third material layers, respectively, extending the opening through the preliminary bottom spacer, and forming a contact plug including at least one protrusion that is disposed between the sidewall spacers, within the opening.

DETAILED DESCRIPTION

Hereinafter, embodiments according to the technical concept of the present disclosure are described with reference to the accompanying drawings.

Embodiments of the present disclosure may provide a semiconductor device and a method of manufacturing the semiconductor device having a stable structure and improved characteristics.

According to the present invention, a semiconductor device having a stable structure and improved reliability is provided.

Figure 1A:
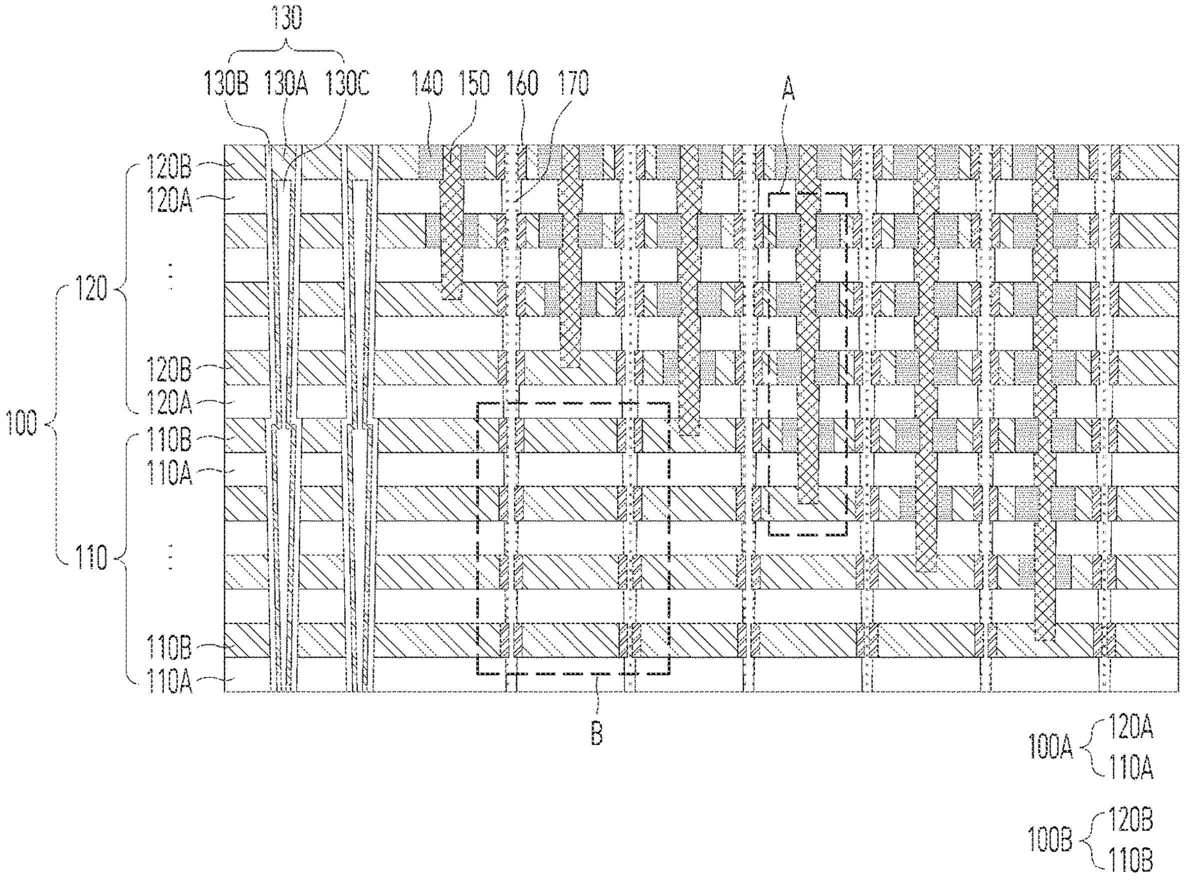
FIGS. 1A to 1E are diagrams illustrating a semiconductor device according to an embodiment of the present invention disclosure.
Figure 1B:
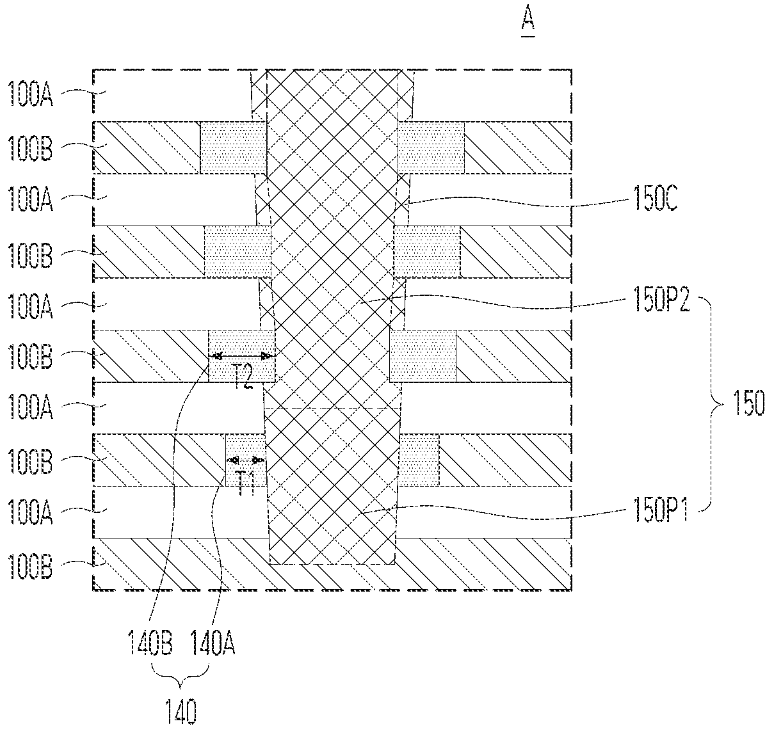
Figure 1C:
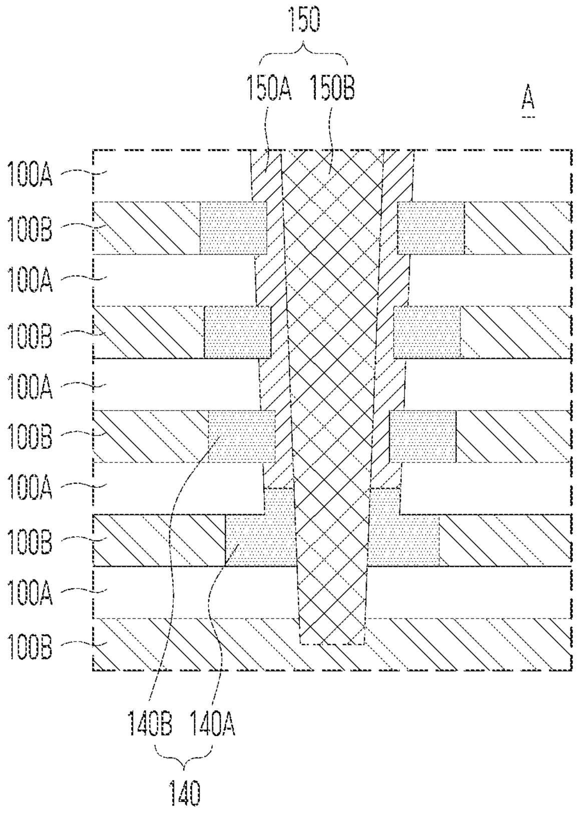
Figure 1D:
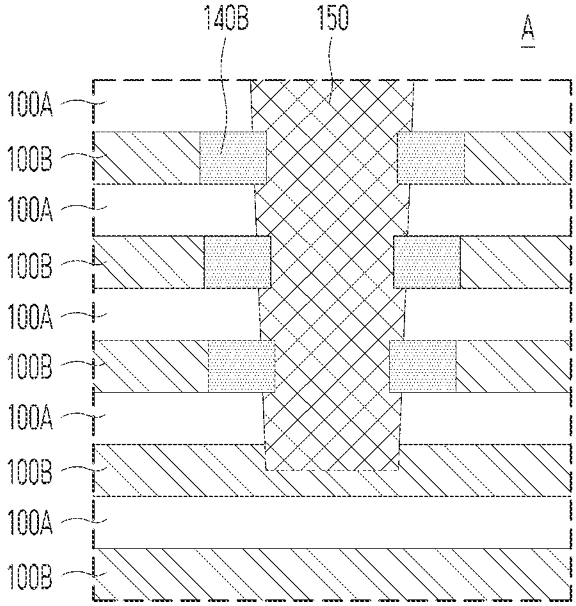
Figure 1E:
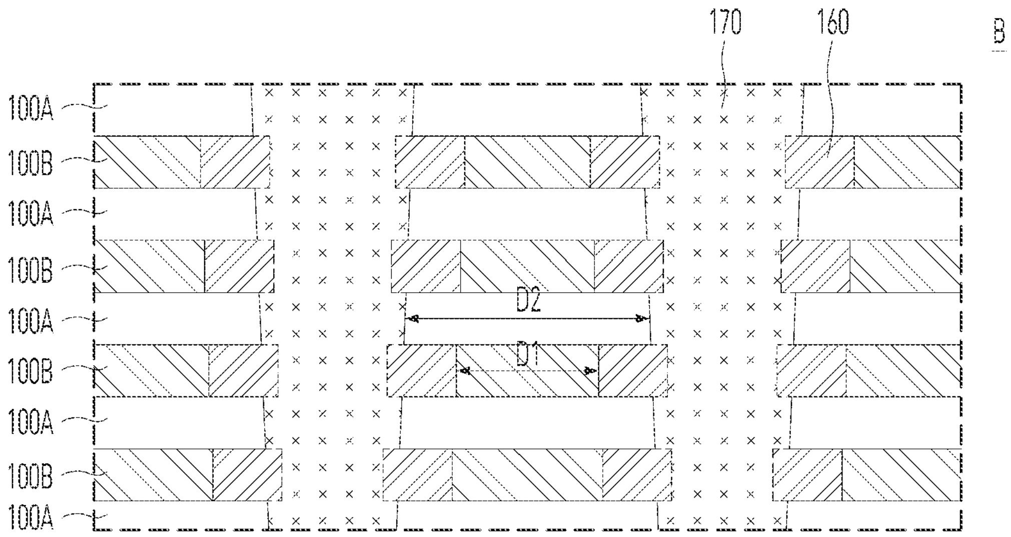

FIGS. 1A to 1E are diagrams illustrating a semiconductor device according to an embodiment of the present invention disclosure. FIGS. 1B to 1D may be enlarged views of a portion A in FIG. 1A. FIG. 1E may be an enlarged view of a portion B in FIG. 1A.

Referring to FIGS. 1A to 1E, the semiconductor device may include a first gate structure 110, a second gate structure 120, channel structures 130, first insulating spacers 140, contact plugs 150, second insulating spacers 160, and supports 170. In an embodiment, the semiconductor device may include the first gate structure 110, the second gate structure 120, the channel structures 130, the first insulating spacers 140, the contact plugs 150, the second insulating spacers 160, or the supports 170 in combination. The second gate structure 120 may be positioned over or on the first gate structure 110 and may each include a plurality of layers extending parallel to each other along a first direction. The channel structures 130, the contact plugs 150, and the supports 170 may be arranged along the first direction, spaced apart from each other, and may extend inside the first and/or the first and second gate structures 110 and 120 in a second direction that is orthogonal to the first direction.

The first gate structure 110 may include first insulating layers 110A and first conductive layers 110B that are alternately stacked. The second gate structure 120 may include first insulating layers 120A and second conductive layers 120B that are alternately stacked. The first gate structure 110 and the second gate structure 120 may be collectively used as a gate structure 100. The first insulating layers 110A and the second insulating layers 120A may be used as insulating layers 100A. The first conductive layers 110B and the second conductive layers 120B may be used as conductive layers 100B. Accordingly, the gate structure 100 may include the insulating layers 100A and the conductive layers 100B that are alternately stacked. The insulating layers 100A may include an insulating material such as, for example, an oxide. The conductive layer 100B may include a conductive material, such as, for example, tungsten, molybdenum, or polysilicon.

The channel structures 130 may extend through the gate structure 100. The channel structures 130 may each include a channel layer 130A. The channel structures 130 may each further include at least one of a memory layer 130B that surrounds the channel layer 130A and an insulating core 130C filling a space remaining within the channel layer 130A.

The contact plug 150 may extend through the gate structure 100, and may be connected to at least one of the conductive layers 100B. For example, the contact plugs 150 may be connected to the conductive layers 100B, respectively. Referring to FIG. 1B, the contact plug 150 may include a first part 150P1 that is connected to at least one of the conductive layers 100B and a second part 150P2 that is connected to the first part 150P1 and extending through the gate structure 100. The widths of the first part 150P1 and the second part 150P2 may be substantially the same or different from each other. For example, the second part 150P2 may have a greater width than the first part 150P1. As shown in FIG. 1B, the width of the contact plug 150 may be increasing gradually from a bottom surface thereof to a top surface thereof. Also, the bottom surface of the contact plug 150 may be positioned inside a corresponding one of the conductive layers 100B.

Referring to FIG. 1C, the contact plug 150 may be composed of multiple layers. For example, the contact plug 150 may include first and second metal layers 150A and 150B. The first metal layer 150A may surround an upper part of the sidewall of the second metal layer 150B. The second metal layer 150B may extend from the top surface to the bottom surface of the contact plug 150 and may extend below a lower surface of the first metal layer 150A. The second metal layer 150B may be in direct contact and connected to at least one of the conductive layers 100B. The first metal layer 150A and the second metal layer 150B may include substantially the same material or may include different materials. For example, the first metal layer 150A may include molybdenum, and the second metal layer 150B may include tungsten.

Referring to FIG. 1D, the contact plug 150 may be connected to at least one of the conductive layers 100B as a single layer. The contact plug 150 may include substantially the same material as the conductive layers 100B. For example, the contact plug 150 may include a conductive material, such as, for example, tungsten or molybdenum.

Referring to FIG. 1C, the first insulating spacers 140 may be disposed between the respective conductive layers 100B and the contact plug 150. The first insulating spacers 140 may each be disposed at a level corresponding to each of the conductive layers 100B. The first insulating spacers 140 may be an oxide layer. The first insulating spacers 140 may include a bottom spacer 140A and sidewall spacers 140B. The bottom spacer 140A may be a first insulating spacer that is disposed to be closest to the bottom of the contact plug 150, among the first insulating spacers 140. The sidewall spacers 140B may be the remaining first insulating spacers 140 except the bottom spacer 140A, among the first insulating spacers 140. For example, the bottom spacer 140A may be the lowest first insulating spacer, and the sidewall spacers 140B may be the remaining first insulating spacers except the lowest first insulating spacer.

The first insulating spacers 140 may each include at least one of the bottom spacer 140A and the sidewall spacers 140B. Referring to FIGS. 1B and 1C, the first insulating spacer 140 may include the bottom spacer 140A and the sidewall spacers 140B. Referring to FIG. 1D, the first insulating spacer 140 may not include the bottom spacer 140A, and may only include the sidewall spacers 140B. The reason for this is that the bottom spacer 140A may be removed in a process of forming the contact plug 150.

Referring to FIG. 1B, the bottom spacer 140A may have a first thickness T1. The sidewall spacers 140B may each have a second thickness T2 different from the first thickness T1. For example, the second thickness T2 may be greater than the first thickness T1. However, the present disclosure is not limited to such an example, and in some embodiments the first thickness T1 and the second thickness T2 may be substantially the same.

The first insulating spacers 140 may surround the sidewall of the contact plug 150 at the level of the conductive layers to isolate the contact plug 150 from the conductive layers 100B except for a bottom part of the contact plug 150 which is in direct contact with a corresponding one of the conductive layers 100B. Referring to FIG. 1B, the bottom spacer 140A may surround the first part 150P1 of the contact plug 150, and the sidewall spacers 140B may surround the second part 150P2 of the contact plug 150. Referring to FIG. 1C, the bottom spacer 140A may surround the second metal layer 150B, and the sidewall spacers 140B may surround the first metal layer 150A. Referring to FIG. 1D, the sidewall spacers 140B may surround the sidewall of the contact plug 150.

The first insulating spacers 140 may protrude into the contact plug 150. For example, the bottom spacer 140A may protrude into the contact plug 150. The sidewall spacers 140B may protrude into the contact plug 150. Referring to FIGS. 1B and 1C, a degree that the sidewall of the bottom spacer 140A protrudes into the contact plug 150 and a degree that the sidewalls of the sidewall spacers 140B protrude into the contact plug 150 may be different from each other. For example, the sidewalls of the sidewall spacers 140B may protrude more into the contact plug 150 than the sidewall of the bottom spacer 140A. The bottom spacer 140A may not protrude into the contact plug 150. In this case, the sidewall of the bottom spacer 140A may come into contact with the sidewall of the contact plug 150. For example, the bottom spacer 140A may be aligned with the sidewalls of the insulating layers 100A.

The first insulating spacers 140 may be for insulating the remaining conductive layers 100B except the conductive layer 100B that is connected to the contact plug 150 and the contact plug 150. The first insulating spacers 140 may prevent or reduce an electrical influence on the contact plug 150 due to the remaining conductive layers 100B although a voltage or a current is sufficiently supplied to the conductive layers 100B. Accordingly, a breakdown voltage may be improved by the first insulating spacers 140.

Referring back to FIG. 1B, the contact plug 150 may include at least one protrusion 150C. The protrusion 150C may protrude from the sidewall of the contact plug 150 to the insulating layer 100A. The protrusion 150C may be disposed between the sidewall spacers 140B. The protrusion 150C may not be present between the bottom spacer 140A and the sidewall spacer 140B. Accordingly, the sidewall of the contact plug 150 may include a flat cross section not having the protrusion 150C and may be aligned with the sidewalls of the insulating layers 100A and the sidewall of the bottom spacer 140A, between the bottom spacer 140A and the sidewall spacer 140B.

Referring to FIG. 1A, the supports 170 may extend through the gate structure 100. A contact plug 150 may be disposed between each pair of the supports 170. The supports 170 may prevent the gate structure 100 from becoming bent or distorted. The supports 170 may each include an insulating material such as, for example, an oxide.

The second insulating spacers 160 may be disposed between the respective conductive layers 100B and the support 170. The second insulating spacers 160 may each be disposed at a level corresponding to each of the conductive layers 100B. Referring to FIG. 1E, the second insulating spacers 160 may protrude into the supports 170. The second insulating spacers 160 may have substantially the same thickness. However, the present disclosure is not limited to such an embodiment, and the second insulating spacers 160 may have different thicknesses. The second insulating spacers 160 may be an oxide layer.

The second insulating spacers 160 may prevent the gate structure 100 from becoming bent or distorted or for reducing the bending of the gate structure 100. In other words, the second insulating spacers 160 may be used as a support along with the supports 170, and can prevent the gate structure 100 from becoming bent or distorted. However, if a distance between the supports 170 is great, bearing power that supports the gate structure 100 may be small. Also, if the distance between the supports 170 is small, the bearing power may be great. Moreover, the ability to reduce the distance between the supports 170 is limited by the contact plugs 150 disposed between the supports 170. Accordingly, an effect in which the distance between the supports 170 is reduced may be derived by disposing the second insulating spacers 160 on the sidewalls of the supports 170. For example, the second insulating spacers 160 that are adjacent to each other may be disposed to be spaced apart from each other by a first distance D1. The supports 170 that are adjacent to each other may be disposed to be spaced apart from each other by a second distance D2. In this case, the first distance D1 may be smaller than the second distance D2. Accordingly, the bearing power can be increased by using both the supports 170 and the second insulating spacers 160 as a support.

For reference, the second insulating spacers 160 and the supports 170 may be separate layers that are formed by a separate process. However, an interface between the second insulating spacer 160 and the support 170 may be detectable or not detectable depending on materials the deposition methods, etc. for making the second insulating spacers 160 and the supports 170.

According to the aforementioned structure, the first insulating spacers 140 may be disposed between the respective conductive layers 100B and the contact plug 150. Although a sufficient voltage or current is supplied to the conductive layers 100B, the contact plug 150 can be prevented from being subjected to an electrical influence due to the remaining conductive layers 100B except the conductive layer 100B that is connected to the contact plug 150. Accordingly, a breakdown voltage can be improved by the first insulating spacers 140.

The second insulating spacers 160 may be disposed between the respective conductive layers 100B and the supports 170. Accordingly, the bearing power that supports the gate structure 100 can be increased by using both the second insulating spacers 160 and the supports 170 for supporting the gate structure 100.

FIGS. 2A to 2E are diagrams illustrating a method of manufacturing a semiconductor device according to an embodiment of the present invention disclosure. Hereinafter, any contents which are repetitive or redundant with the aforementioned contents may be omitted.

Referring to FIGS. 2A to 2E, a sub-first stack 210 may be formed by alternately stacking sub-first material layers 210A and sub-second material layers 210B. The sub-first material layers 210A may each include an insulating material such as, for example, an oxide. The sub-second material layers 210B may each include a sacrificial material such as, for example, a nitride.

Next, a first channel sacrificial layer 220A1 may be formed within the sub-first stack 210. The first channel sacrificial layer 220A1 may include a material having etch selectivity relative to the sub-first material layers 210A and the sub-second material layers 210B, meaning that the first channel sacrificial layer 220A1 may be etched selectively. For example, the first channel sacrificial layer 220A1 may include a sacrificial material such as, for example, tungsten.

Support sacrificial layers 230A may be formed within the sub-first stack 210. The support sacrificial layer 230A may include a material having etch selectivity relative to the sub-first material layers 210A and the sub-second material layers 210B. For example, the support sacrificial layer 230A may include a sacrificial material such as, for example, tungsten.

Contact sacrificial layers 240A may be formed within the sub-first stack 210. The contact sacrificial layers 240A may each be formed to be connected to at least one of the sub-second material layers 210B. Accordingly, the heights of the contact sacrificial layers 240A may be different from each other. The contact sacrificial layer 240A may include a material having etch selectivity relative to the sub-first material layers 210A and the sub-second material layers 210B. For example, the contact sacrificial layer 240A may include a sacrificial material such as, for example, tungsten.

Next, a sub-second stack 250 may be formed by alternately stacking sub-third material layers 250A and sub-fourth material layers 250B on the sub-first stack 210. The sub-third material layers 250A may include substantially the same material as the sub-first material layers 210A. The sub-fourth material layers 250B may include substantially the same material as the sub-second material layers 210B. In this case, the sub-first stack 210 and the sub-second stack 250 may be collectively used as a stack 200. The sub-first material layers 210A and the sub-third material layers 250A may be used as first material layers 200A. The sub-second material layers 210B and the sub-fourth material layers 250B may be used as second material layers 200B.

Next, a second channel sacrificial layer 220A2 extending through the sub-second stack 250 and that is connected to the first channel sacrificial layer 220A1 may be formed. Accordingly, a channel sacrificial layer 220A including the first channel sacrificial layer 220A1 and the second channel sacrificial layer 220A2 may be formed. The second channel sacrificial layer 220A2 may include substantially the same material as the first channel sacrificial layer 220A1. For example, the second channel sacrificial layer 220A2 may include a sacrificial material such as, for example, tungsten.

Figure 2A:
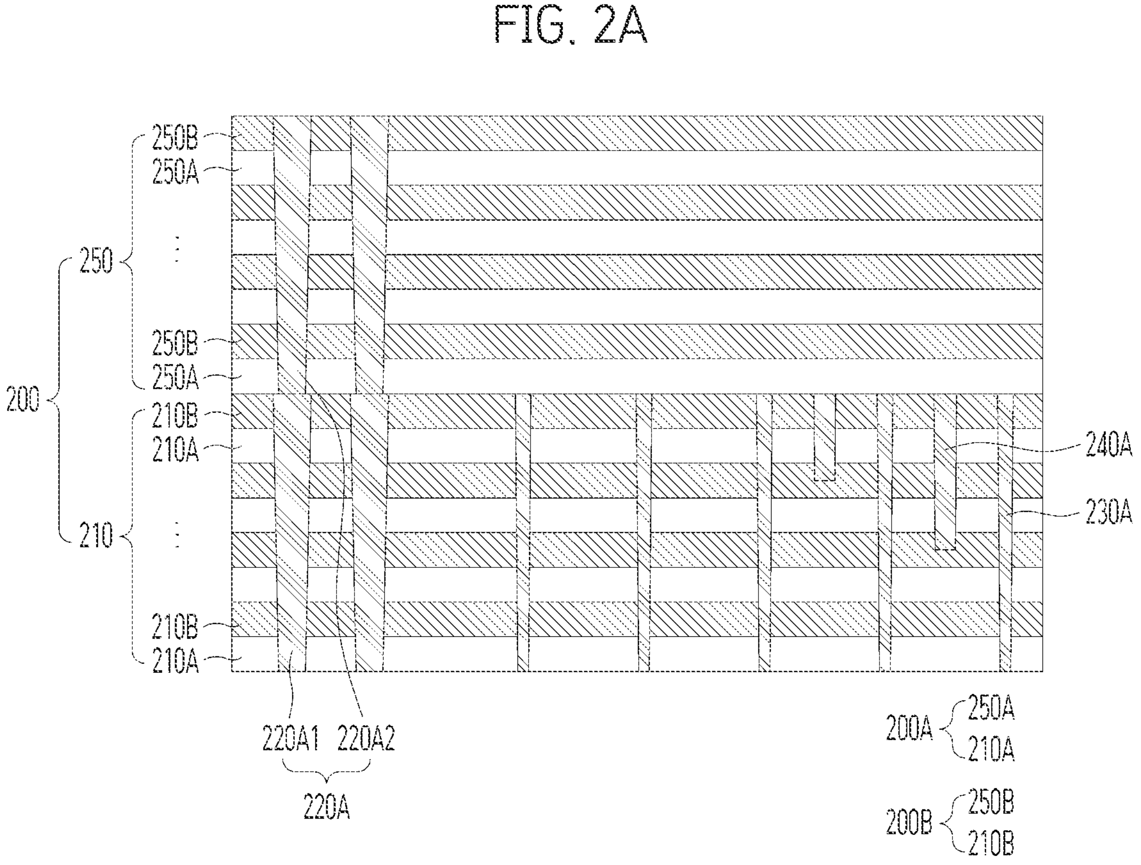
FIGS. 2A to 2E are diagrams illustrating a method of manufacturing a semiconductor device according to an embodiment of the present invention disclosure.
Figure 2B:
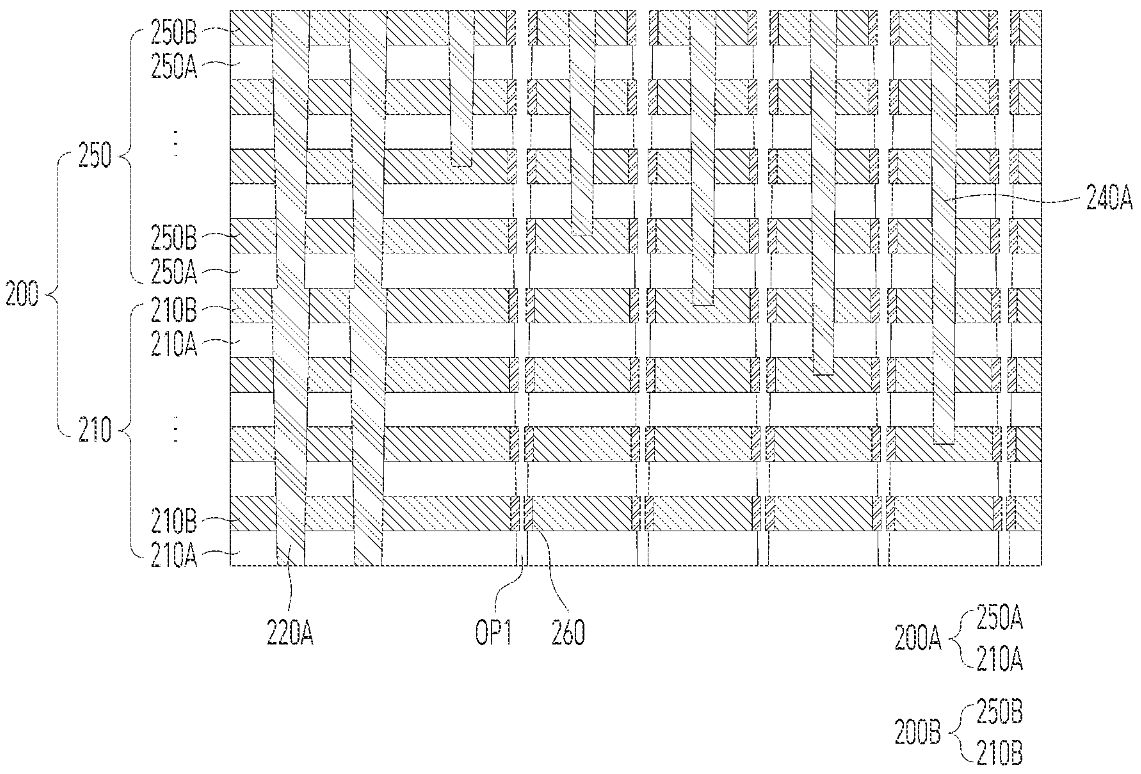

Referring to FIG. 2B, first openings OP1 extending through the stack 200 may be formed. First, the first openings OP1 may be formed to expose the support sacrificial layers 230A through the sub-second stack 250. Next, the first openings OP1 may be extended by removing the support sacrificial layers 230A through the first openings OP1. In this case, the second material layers 200B may be exposed by the first openings OP1.

Next, second insulating spacers 260 may be formed by oxidizing the second material layers 200B through the first openings OP1. In this case, the second insulating spacers 260 may protrude into the first openings OP1. The second insulating spacers 260 may prevent or reduce the bending of the stack 200.

The contact sacrificial layers 240A extending through the stack 200 may be formed. First, second openings extending through the sub-second stack 250 may be formed. The second openings may expose the contact sacrificial layers 240A that have been formed within the sub-first stack 210, respectively, or may expose the fourth material layers 240B of the sub-second stack 250. Next, the contact sacrificial layers 240A may be additionally formed within the second openings.

Figure 2C:
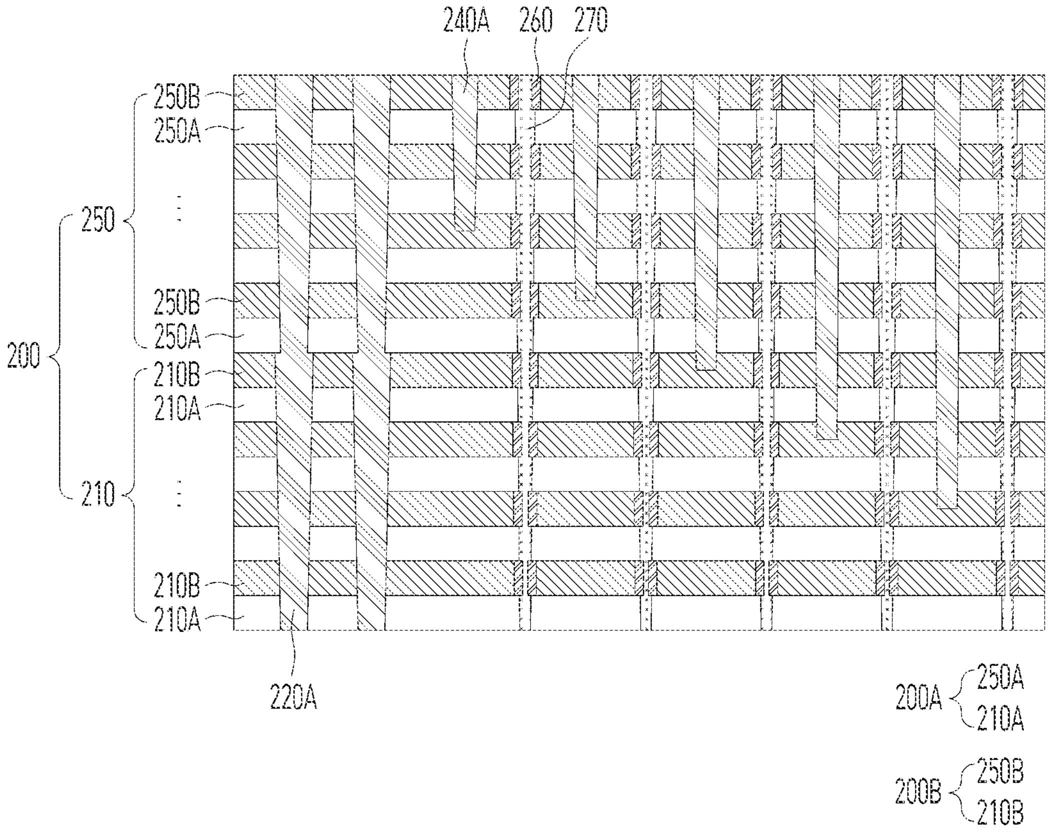

Referring to FIG. 2C, supports 270 may be formed within the first openings OP1, respectively. The supports 270 may each include an insulating material such as, for example, an oxide. The supports 270 and the second insulating spacers 260 may be separate layers that are formed by separate processes, but an interface between the support 270 and the second insulating spacer 260 may be detectable or not detectable depending on whether the same material is used and the method of deposition. The supports 270 may prevent or reduce the distortion or bending of the stack 200. A distance between the second insulating spacers 260 may be relatively smaller than a distance between the supports 270 that are adjacent to each other. Accordingly, the bearing power of the stack 200 can be increased because both the supports 270 and the second insulating spacers 260 are used as a support for the stack.

Figure 2D:
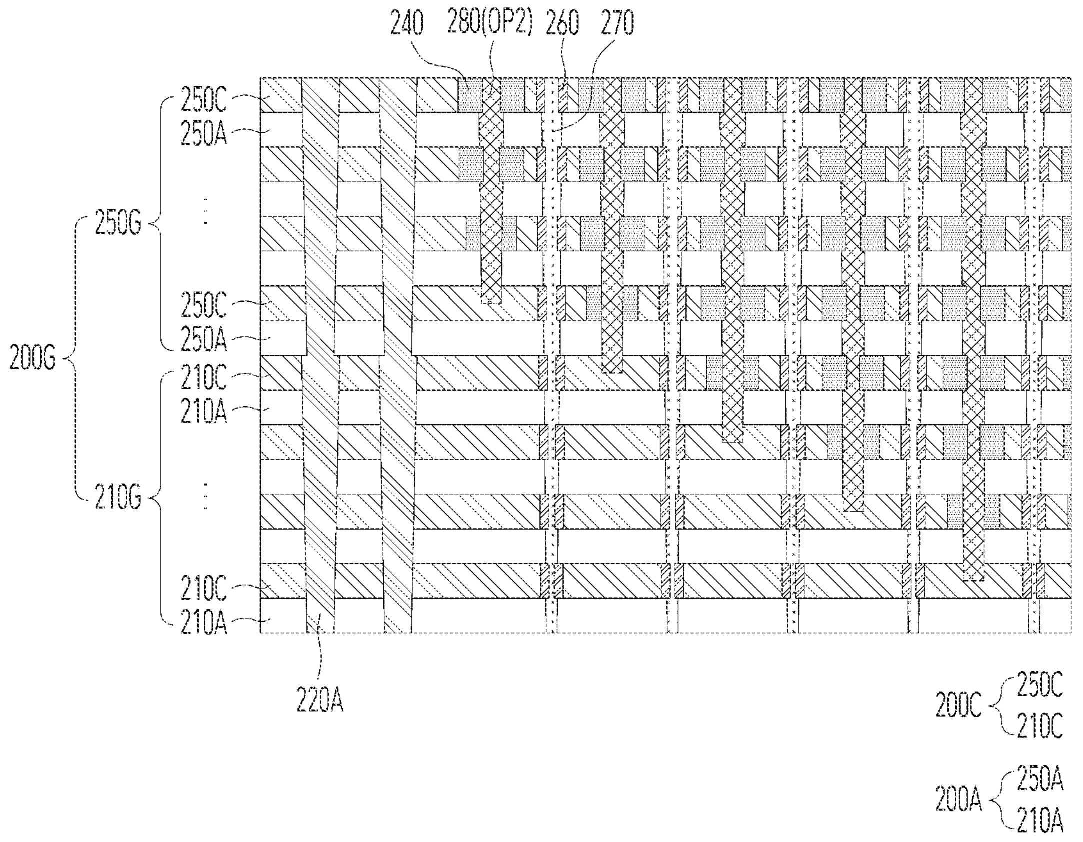

Referring to FIG. 2D, the second openings OP2 may be formed by removing the contact sacrificial layers 240A. In this case, the second openings OP2 may extend through the stack 200, and may be formed between the supports 270. The second openings OP2 may expose the second material layers 200B.

Next, first insulating spacers 240 may be formed by oxidizing the second material layers 200B that are exposed through the second openings OP2. The first insulating spacers 240 may be for insulating a contact plug 280 and third material layers 200C in a subsequent process.

Next, the contact plugs 280 may be formed within the second openings OP2, respectively. First, the second openings OP2 may each be extended into the stack 200 by etching the first insulating spacer 240 that has been formed at the bottom of the second opening OP2, among the first insulating spacers 240. Next, the contact plugs 280 may be formed within the second openings OP2, respectively. In this case, the contact plugs 280 may include a conductive material, such as, for example, tungsten or molybdenum.

A gate structure 200G may be formed by substituting the second material layers 200B with the third material layers 200C. The gate structure 200G may include a sub-first gate structure 210G and a sub-second gate structure 250G. The third material layers 200C may include sub-fifth material layers 210C and sub-sixth material layers 250C. First, a slit extending through the stack 200 may be formed. Next, the second material layers 200B may be substituted with the third material layers 200C through the slit. In this case, the third material layers 200C may each include a conductive material, such as, for example, tungsten or molybdenum, and may be used as gate lines. Accordingly, the third material layers 200C and the contact plugs 280 may be connected. The sidewalls of the contact plugs 280 may be surrounded by the first insulating spacers 240. Accordingly, the first insulating spacers 240 can prevent or reduce an electrical influence on the contact plug 280 although a voltage or a current is sufficiently supplied to the remaining third material layers 200C except the third material layer 200C that is connected to the contact plug 280.

For reference, the gate structure 200G may be formed before the contact plugs 280 are formed. For example, after a mask pattern that covers the second openings OP2 is formed, the gate structure 200G may be formed. Next, after the mask pattern is removed, the contact plugs 280 may be formed.

Figure 2E:
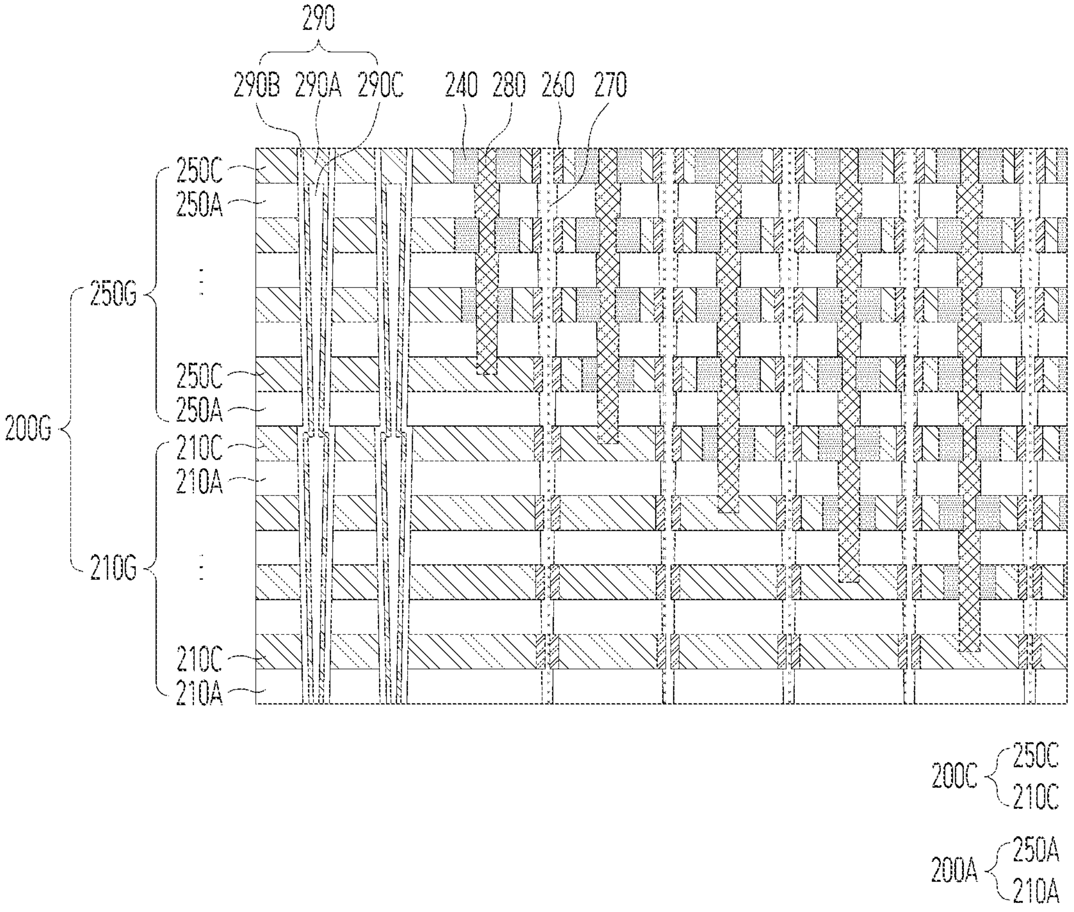

Referring to FIG. 2E, channel structures 290 may be formed. First, the channel sacrificial layers 220A may be removed. In this case, the mask pattern that covers the contact plugs 280 and the supports 270 may be formed. Next, the channel structures 290 may be formed at locations from which the channel sacrificial layers 220A have been removed, respectively. The channel structure 290 may include a channel layer 290A, a memory layer 290B that surrounds the channel layer 290A, and an insulating core 290C within the channel layer 290A.

For reference, before the gate structure 200G is formed, the channel structures 290 may be formed. For example, the channel sacrificial layers 220A may be substituted with the channel structures 290, respectively. Next, the gate structure 200G may be formed by substituting the second material layers 200B with the third material layers 200C.

According to the aforementioned manufacturing method, the first insulating spacers 240 may be formed by oxidizing the second material layers 200B that are exposed through the second openings OP2 extending through the stack 200. The first insulating spacers 240 can prevent an electrical influence on the contact plug 280 due to the remaining third material layers 200C except the third material layer 200C that is connected to the contact plug 280.

The second insulating spacers 260 may be formed by oxidizing the second material layers 200B that are exposed through the first openings OP1 extending through the stack 200. The second insulating spacers 260 may be formed to be spaced apart from each other by a relatively small distance, and can prevent the bending of the stack 200 or the gate structure 200G as a support along with the supports 270.

FIGS. 3A to 3D are diagrams illustrating a method of manufacturing a semiconductor device according to an embodiment of the present invention disclosure. Hereinafter, contents redundant with the aforementioned contents are omitted.

Figure 3A:
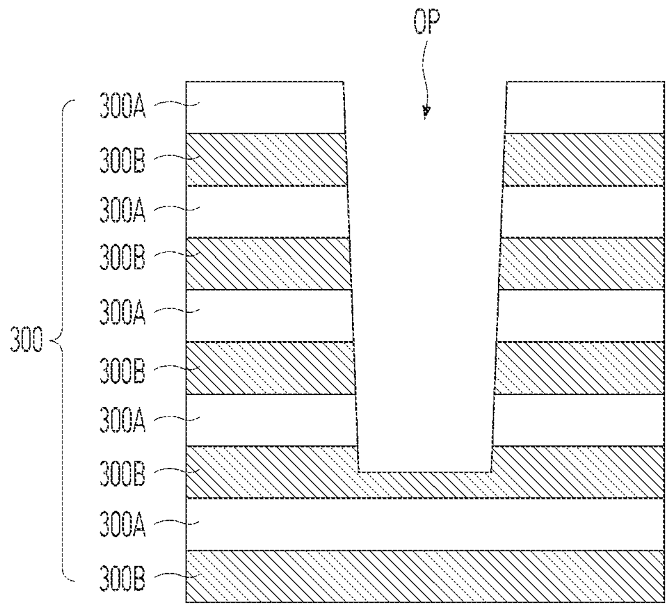
FIGS. 3A to 3D are diagrams illustrating a method of manufacturing a semiconductor device according to an embodiment of the present invention disclosure.

Referring to FIG. 3A, a stack 300 may be formed by alternately stacking first material layers 300A and second material layers 300B. The first material layers 300A may each include an insulating material such as, for example, an oxide. The second material layers 300B may each include a sacrificial material, such as, for example, a nitride or polysilicon. Next, an opening OP extending through the stack

300 and that exposes the second material layers 300B may be formed. The opening OP may partially penetrate the stack 300.

Figure 3B:
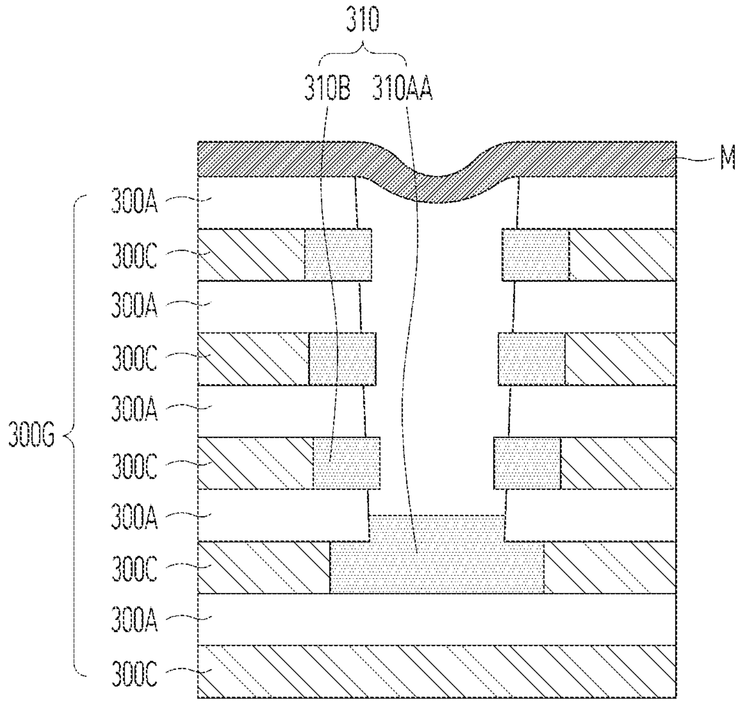

Referring to FIG. 3B, an insulating spacer 310 may be formed by oxidizing the second material layers 300B that have been exposed by the opening OP. The insulating spacer 310 may include a preliminary bottom spacer 310AA and sidewall spacers 310B. The preliminary bottom spacer 310AA may be an insulating spacer that has been formed at the bottom of the opening OP. The sidewall spacers 310B may be the remaining insulating spacers except the preliminary bottom spacer 310AA. The sidewall spacers 310B may protrude into the opening OP.

Next, a mask pattern M may be formed on the stack 300. The mask pattern M may cover the opening OP. In this case, the mask pattern M may protrude into the opening OP. The protrusion may have a curved shape.

Next, a gate structure 300G may be formed by substituting the second material layers 300B with third material layers 300C, respectively. In this case, the third material layers 300C may each include a conductive material, such as, for example, tungsten or molybdenum. In the gate structure 300G, the third material layers 300C may be used as gate lines. Next, the mask pattern M may be removed.

Figure 3C:
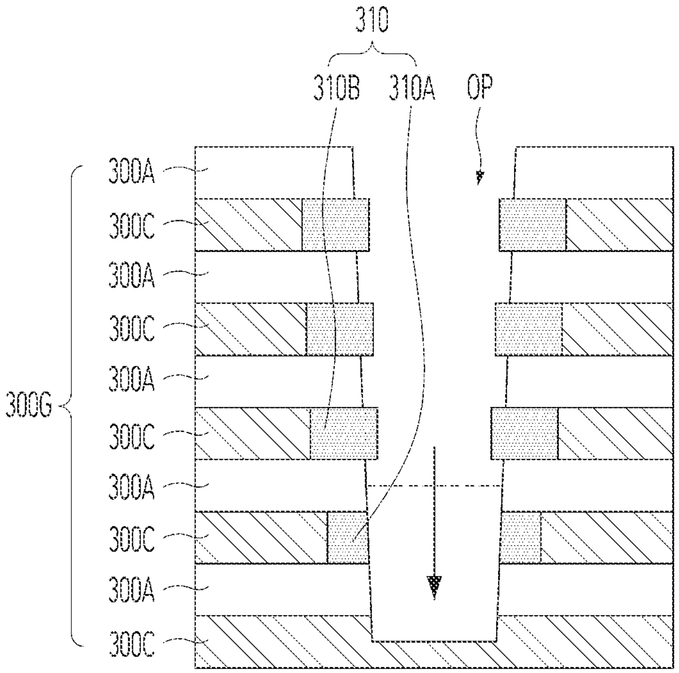

Referring to FIG. 3C, the opening OP may be extended through the preliminary bottom spacer 310AA. For example, at least one of the third material layers 300C may be exposed by etching the preliminary bottom spacer 310AA that has been formed at the bottom of the opening OP. In this case, the preliminary bottom spacer 310AA that remains may be a bottom spacer 310A.

Figure 3D:
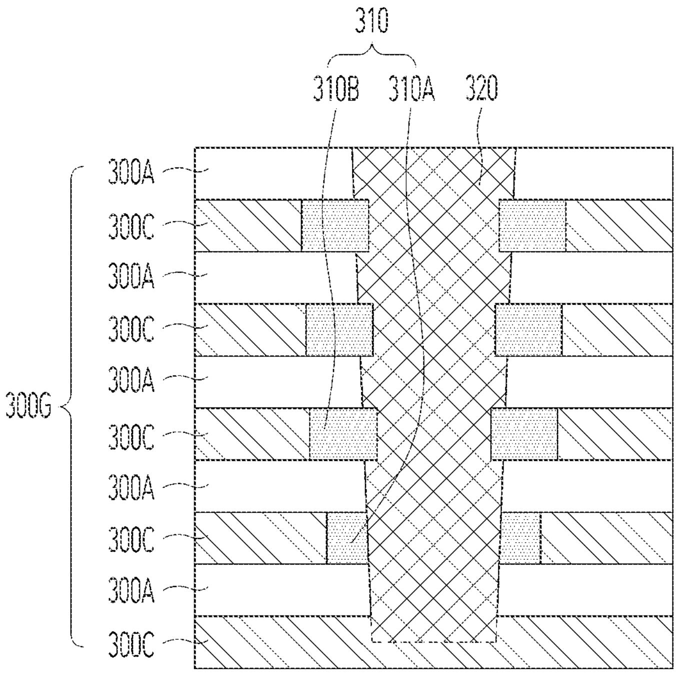

Referring to FIG. 3D, a contact plug 320 may be formed within the opening OP. The contact plug 320 may include at least one protrusion that is disposed between the sidewall spacers 310B. The contact plug 320 may be connected to at least one of the third material layers 300C. The sidewall spacers 310B may each be formed between each of the remaining third material layers 300C except the third material layer 300C that is connected to the contact plug 320 and the contact plug 320. In this case, the sidewall of the bottom spacer 310A may come into contact with the sidewall of the contact plug 320. The sidewall spacers 310B prevent or reduce an electrical influence on the contact plug 320 due to the remaining third material layers 300C although a voltage or a current is sufficiently supplied to the third material layers 300C. Accordingly, a breakdown voltage is improved by the sidewall spacers 310B.

According to the aforementioned manufacturing method, the opening OP extending through the stack 300 may be formed. The insulating spacer 310 may be formed by oxidizing the second material layers 300B that have been exposed by the opening OP. The insulating spacers 310 improve a breakdown voltage by preventing the contact plug 320 from being subjected to an electrical influence due to the remaining third material layers 300C except the third material layer 300C that is connected to the contact plug 320.

FIGS. 4A to 4D are diagrams illustrating a method of manufacturing a semiconductor device according to an embodiment of the present invention disclosure. Hereinafter, contents redundant with the aforementioned contents are omitted.

Figure 4A:
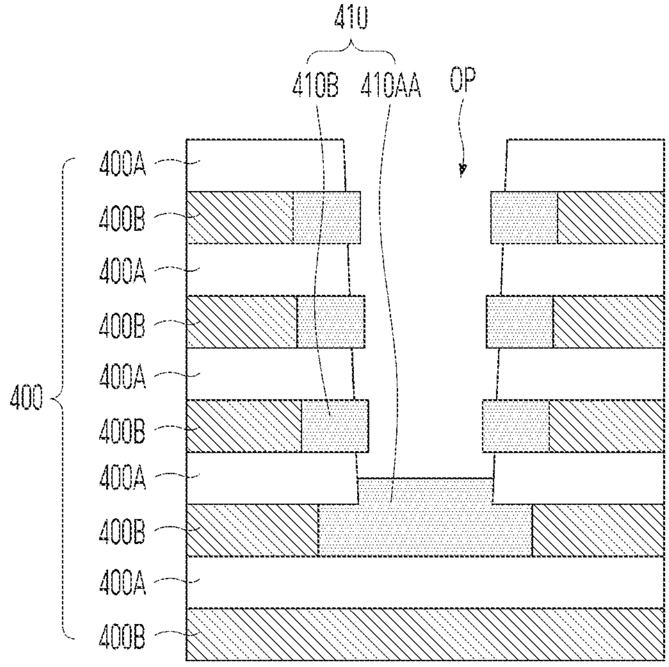
FIGS. 4A to 4D are diagrams illustrating a method of manufacturing a semiconductor device according to an embodiment of the present invention disclosure.

Referring to FIG. 4A, a stack 400 may be formed by alternately stacking first material layers 400A and second material layers 400B. Next, an opening OP extending through the stack 400 may be formed. Next, an insulating spacer 410 may be formed by oxidizing the second material layers 400B that have been exposed by the opening OP. The insulating spacer 410 may include a preliminary bottom spacer 410AA and sidewall spacers 410B. In this case, the preliminary bottom spacer 410AA may be an insulating spacer that has been formed at the bottom of the opening OP. The sidewall spacers 410B may be the remaining insulating spacers except the preliminary bottom spacer 410AA.

Figure 4B:
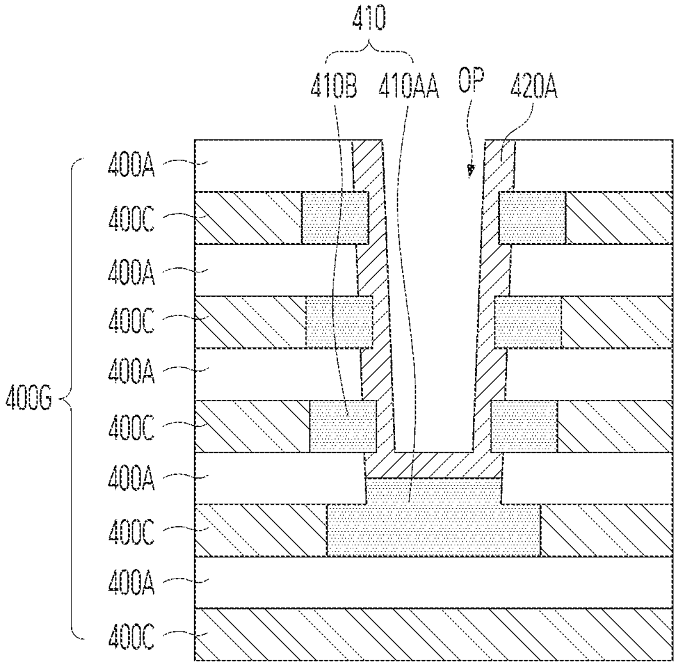

Referring to FIG. 4B, a gate structure 400G may be formed by substituting the second material layers 400B with third material layers 400C, respectively. The third material layers 400C may each include a conductive material, such as, for example, tungsten or molybdenum.

A first metal layer 420A may be formed within the opening OP. For example, when the third material layers 400C are formed, the first metal layer 420A may be formed. The first metal layer 420A may be conformally formed within the opening OP. In this case, the first metal layer 420A may include substantially the same material as the third material layers 400C. For example, the first metal layer 420A may include a conductive material, such as, for example, tungsten or molybdenum.

Figure 4C:
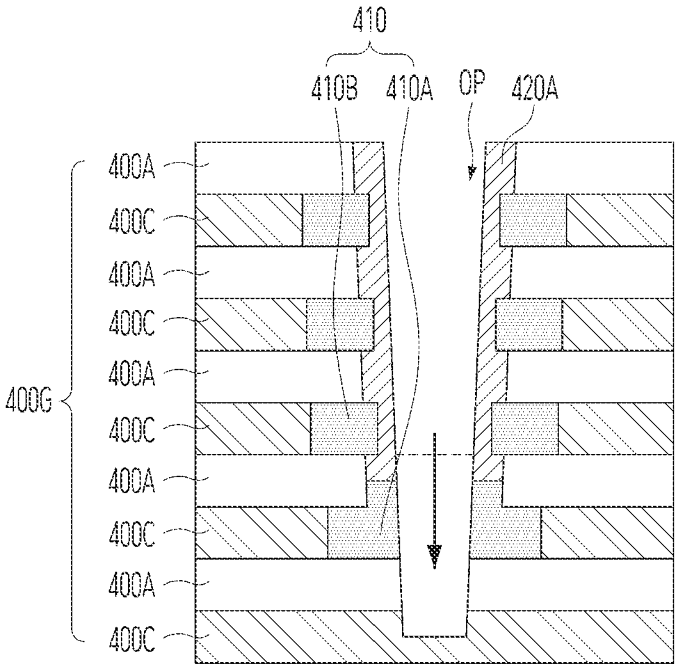

Referring to FIG. 4C, the opening OP may be extended by etching the first metal layer 420A that has been formed at the bottom of the opening OP. In this case, the opening OP may be extended through the preliminary bottom spacer 410AA. The preliminary bottom spacer 410AA that remains may be a bottom spacer 410A. The opening OP may extend and expose at least one of the third material layers 400C.

Figure 4D:
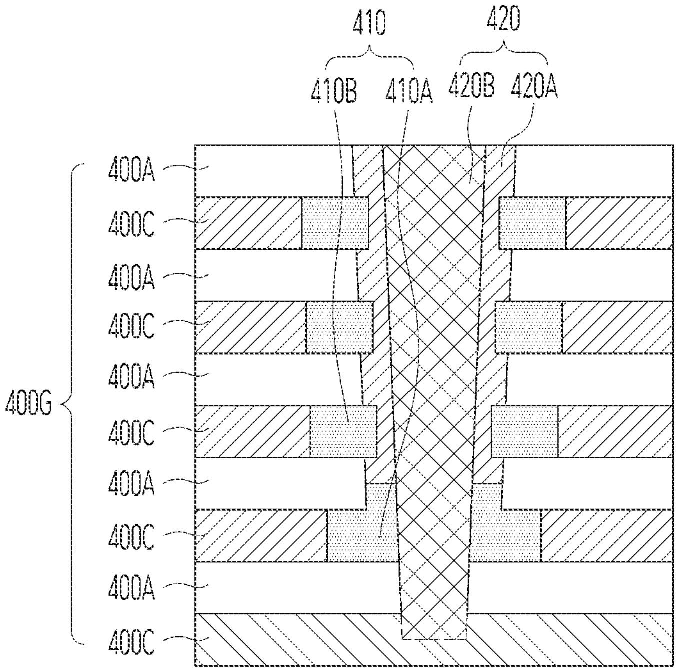

Referring to FIG. 4D, a second metal layer 420B may be formed within the opening OP. Accordingly, a contact plug 420 including the first metal layer 420A and the second metal layer 420B may be formed. The second metal layer 420B may include a conductive material, such as, for example, tungsten or molybdenum. The second metal layer 420B may include substantially the same material as the first metal layer 420A or may include a material different from the first metal layer 420A. For example, the first metal layer 420A may include molybdenum, and the second metal layer 420B may include tungsten.

According to the aforementioned manufacturing method, when the third material layers 400C for forming the gate structure 400G are formed, the first metal layer 420A may be formed within the opening OP. Accordingly, a process time and a process cost are reduced because a process of forming the gate structure 400G and a process of forming the first metal layer 420A are simultaneously performed.

Figure 5A:
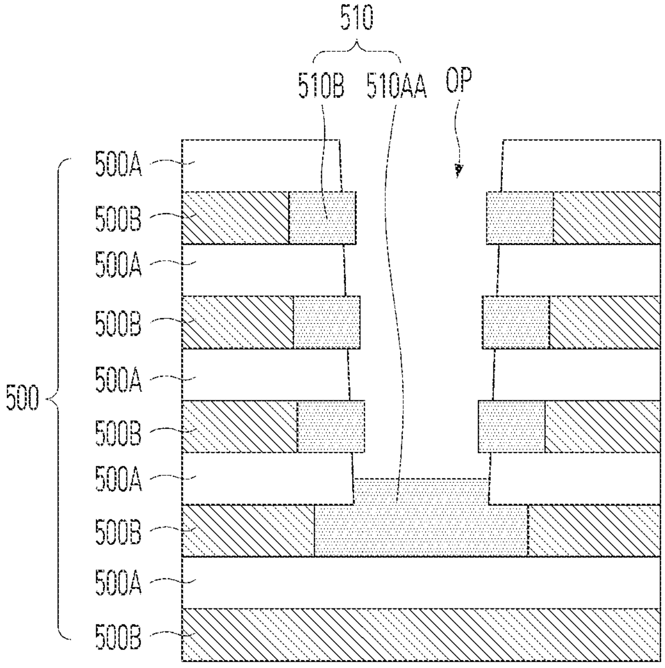
FIGS. 5A to 5C are diagrams illustrating a method of manufacturing a semiconductor device according to an embodiment of the present invention disclosure.
Figure 5B:
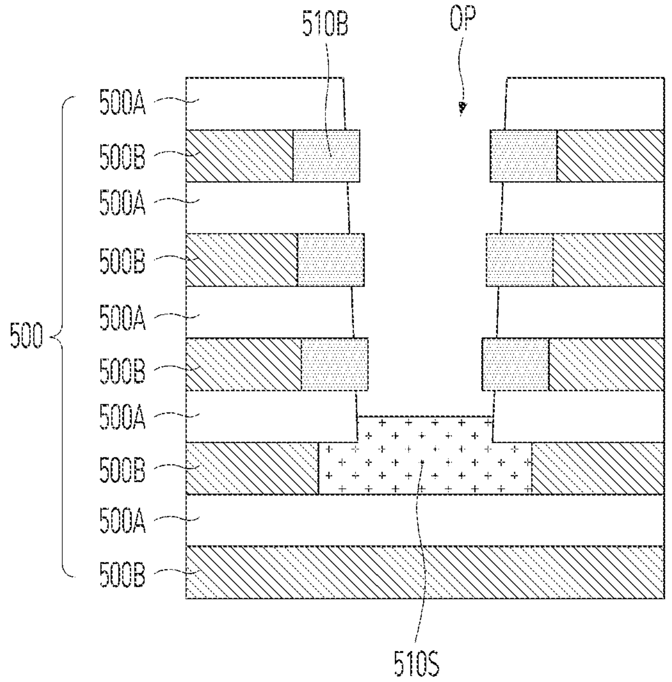
Figure 5C:
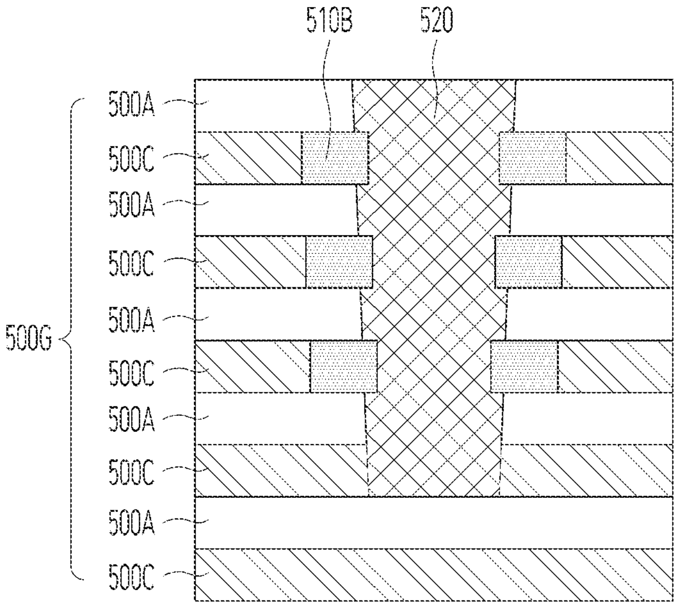

FIGS. 5A to 5C are diagrams illustrating a method of manufacturing a semiconductor device according to an embodiment of the present invention disclosure. Hereinafter, any contents which are repetitive or redundant with the aforementioned contents may be omitted.

Referring to FIG. 5A, a stack 500 may be formed by alternately stacking first material layers 500A and second material layers 500B. In this case, the second material layers 500B may include a material having etch selectivity relative to the first material layers 500A. For example, the second material layer 500B may include nitride, and the first material layer 500A may include oxide. Next, an opening OP extending through the stack 500 may be formed. Next, an insulating spacer 510 may be formed by oxidizing the second material layers 500B that have been exposed by the opening OP. The insulating spacer 510 may include a preliminary bottom spacer 510AA and sidewall spacers 510B.

Referring to FIG. 5B, the preliminary bottom spacer 510AA may be doped with impurities to form a preliminary bottom spacer 510S. If the preliminary bottom spacer 510AA is doped with impurities, the etch rate of the preliminary bottom spacer 510S may be changed. In this case, the preliminary bottom spacer 510AA may be doped with impurities so that the etch rate of the preliminary bottom spacer 510S is similar to or substantially the same as the etch rate of the second material layers 500B or different from the etch rate of the first material layers 500A. However, the present disclosure is not limited to such an embodiment, and the etch rate of the preliminary bottom spacer 510S may be different from the etch rates of the second material layers 500B and the first material layers 500A.

Referring to FIG. 5C, a gate structure 500G may be formed by substituting the second material layers 500B with third material layers 500C, respectively. The second material layers 500B may be selectively removed because the second material layers 500B may include a material having etch selectivity relative to the first material layers 500A. The third material layers 500C may each include a conductive material, such as, for example, tungsten or molybdenum.

The preliminary bottom spacer 510S may be selectively removed. For example, when the second material layers 500B are removed, the preliminary bottom spacer 510S may be selectively removed. The etch rate of the preliminary bottom spacer 510S may be different from the etch rate of the first material layers 500A and may be similar to the etch rate of the second material layers 500B because the preliminary bottom spacer 510S has been doped with impurities. When the second material layers 500B are removed, the preliminary bottom spacer 510S may also be removed.

Next, a contact plug 520 may be formed within the opening OP. The sidewall spacers 510B may surround the sidewall of the contact plug 520. According to an embodiment of the present disclosure, a bottom spacer may not be present. The reason for this is that the preliminary bottom spacer 510S is removed in the process of removing the second material layers 500B. In this case, the contact plug 520 may include a conductive material, such as, for example, tungsten or molybdenum.

According to the aforementioned manufacturing method, the preliminary bottom spacer 510S may be formed by doping the preliminary bottom spacer 510AA with impurities through the opening OP. The preliminary bottom spacer 510S may have an etch rate different from the etch rate of the first material layers 500A and may have an etch rate similar to the etch rate of the second material layers 500B. Accordingly, a process time and a process cost are reduced because the preliminary bottom spacer 510S is selectively removed when the second material layers 500B are removed.

Although embodiments according to the technical concept of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical concept of the present disclosure written in the claims. Such substitutions, modifications, and changes may be said to belong to the scope of the present invention disclosure.

What is claimed is:

1. A semiconductor device comprising:

a gate structure comprising insulating layers and conductive layers that are alternately stacked, wherein each of the conductive layers is disposed between adjacent insulating layers in a vertical direction;

contact plugs extending through the gate structure and having different heights from one another, each of the contact plugs being connected to a corresponding one of the conductive layers; and first insulating spacers that are disposed between the conductive layers and the contact plugs, wherein a lowest first insulating spacer, among the first insulating spacers, has a first thickness, and remaining first insulating spacers each have a second thickness greater than the first thickness, and wherein the remaining first insulating spacers protrude into the contact plugs.

2. The semiconductor device of claim 1, wherein a sidewall of the lowest first insulating spacer directly contacts a sidewall of the contact plugs.

3. The semiconductor device of claim 1, further comprising:

supports extending through the gate structure; and second insulating spacers that are disposed between the conductive layers and the supports.

4. The semiconductor device of claim 3, wherein the second insulating spacers protrude into the supports.

5. The semiconductor device of claim 3, wherein each of the contact plugs is disposed between the supports.

6. The semiconductor device of claim 3, wherein each of the supports comprises an oxide.

7. The semiconductor device of claim 1, wherein each of the contact plugs comprises a first metal layer and a second metal layer within the first metal layer.

8. The semiconductor device of claim 7, wherein:

the first metal layer surrounds a part of a sidewall of the second metal layer, and the second metal layer is connected to at least one of the conductive layers.

9. The semiconductor device of claim 7, wherein:

the first metal layer comprises molybdenum, and the second metal layer comprises tungsten.

10. The semiconductor device of claim 1, further comprising channel structures extending through the gate structure.

11. A semiconductor device comprising:

a gate structure comprising insulating layers and conductive layers that are alternately stacked;

a contact plug comprising a first part that is connected to at least one of the conductive layers and a second part that is connected to the first part and extends through the gate structure;

a bottom spacer that surrounds the first part of the contact plug; and sidewall spacers that surround the second part of the contact plug, wherein the sidewall spacers are spaced apart from the bottom spacer in a vertical direction, wherein the sidewall spacers are spaced apart from each other in the vertical direction, and wherein sidewalls of the sidewall spacers protrude more into the contact plug than a sidewall of the bottom spacer.

12. The semiconductor device of claim 11, wherein the contact plug comprises at least one protrusion that protrudes between the sidewall spacers.

13. The semiconductor device of claim 11, wherein the sidewall of the bottom spacer contacts with a sidewall of the contact plug.

14. The semiconductor device of claim 11, wherein the second part has a greater width than the first part.

15. The semiconductor device of claim 11, wherein:

the bottom spacer has a first thickness, and the sidewall spacers each have a second thickness greater than the first thickness.

16. The semiconductor device of claim 11, further comprising:

supports extending through the gate structure; and insulating spacers that are disposed between the conductive layers and the supports.

17. The semiconductor device of claim 16, wherein the insulating spacers protrude into the supports.

18. The semiconductor device of claim 16, wherein the contact plug is disposed between the supports.

19. The semiconductor device of claim 16, wherein the supports each comprise oxide.

20. The semiconductor device of claim 11, wherein the contact plug comprises a first metal layer and a second metal layer within the first metal layer.

21. The semiconductor device of claim 20, wherein:

the sidewall spacers surround the first metal layer, and the bottom spacer surrounds the second metal layer.

22. The semiconductor device of claim 20, wherein:

the first metal layer comprises molybdenum, and the second metal layer comprises tungsten.

23. The semiconductor device of claim 11, further comprising channel structures extending through the gate structure.

* * * * *